United States Patent
McNutt (10) Patent No.: US 9,626,950 B2
(45) Date of Patent: Apr. 18, 2017

(54) AUDIO SYSTEM AND METHOD FOR REDUCTION AND/OR ELIMINATION OF DISTORTION

(71) Applicant: Dennis McNutt, Costa Mesa, CA (US)

(72) Inventor: Dennis McNutt, Costa Mesa, CA (US)

(*) Notice: Subject to any disclaimer, the term of this patent is extended or adjusted under 35 U.S.C. 154(b) by 0 days.

(21) Appl. No.: 14/748,748

(22) Filed: Jun. 24, 2015

(65) Prior Publication Data
US 2016/0240181 A1    Aug. 18, 2016

Related U.S. Application Data

(63) Continuation-in-part of application No. 14/622,734, filed on Feb. 13, 2015.

(51) Int. Cl.
| | | |
|---|---|---|
| H04R 29/00 | (2006.01) | |
| G10K 11/00 | (2006.01) | |
| H03G 3/20 | (2006.01) | |
| H04S 7/00 | (2006.01) | |

(52) U.S. Cl.
CPC ............. *G10K 11/002* (2013.01); *H03G 3/20* (2013.01); *H04S 7/301* (2013.01); *H04S 2400/09* (2013.01)

(58) Field of Classification Search
CPC ... G10K 11/002; H04S 7/301; H04S 2400/09; H03G 3/20; H04R 3/002; H04R 29/00; H04R 29/001; H04R 29/004
USPC .............................. 381/56, 58, 59, 94.2, 71.1
See application file for complete search history.

(56) References Cited

U.S. PATENT DOCUMENTS

| | | | | |
|---|---|---|---|---|
| 5,481,615 A | * | 1/1996 | Eatwell .............. | G10K 11/1784 381/103 |
| 2001/0014161 A1 | * | 8/2001 | Baiker ................ | H04M 1/6016 381/59 |
| 2001/0043704 A1 | * | 11/2001 | Schwartz ................. | H03G 3/32 381/98 |
| 2002/0146136 A1 | * | 10/2002 | Carter, Jr. ............ | H04R 29/001 381/59 |
| 2007/0036377 A1 | * | 2/2007 | Stirnemann .......... | H04R 25/505 381/315 |
| 2011/0135117 A1 | * | 6/2011 | Nystrom .............. | H04R 1/1016 381/122 |
| 2015/0350779 A1 | * | 12/2015 | McNutt .................. | H04R 3/002 381/71.1 |
| 2016/0035334 A1 | * | 2/2016 | McNutt .................. | H04R 3/002 381/94.2 |

* cited by examiner

*Primary Examiner* — Paul S Kim
*Assistant Examiner* — Katherine Faley
(74) *Attorney, Agent, or Firm* — Roy A. Ekstrand (57) ABSTRACT

A microphone or instrument sound pickup for various musical instruments and singers is coupled to an amplifier, the output of which is coupled to a speaker system. A microphone is positioned within the output range of the speaker system and is coupled to one input of a comparator circuit. The remaining input of the comparator circuit is coupled to the microphones or pickups. An additive device receives the output signal of the comparator and the originating signal from the microphones or pickups to form a correcting audio signal which is applied to the amplifier. In an alternate embodiment, an adaptive preamplifier is interposed between the originating microphones and audio pickups and the amplifier. The adaptive preamplifier receives the output of the comparator and imposes alteration upon the signal processed through the preamplifier for application to the amplifier.

13 Claims, 7 Drawing Sheets

AUDIO SYSTEM AND METHOD FOR REDUCTION AND/OR ELIMINATION OF DISTORTION

CROSS-REFERENCE TO RELATED APPLICATIONS

This application is a continuation-in-part of application Ser. No. 14/622,734 filed Feb. 13, 2015 in the name of Dennis McNutt, the disclosure of which is hereby incorporated herein by reference, entitled AUDIO SYSTEM AND METHOD FOR REDUCTION AND/OR ELIMINATION OF DISTORTION which application, in turn, claims the benefit of and priority under 35 U.S.C. 119(e) of U.S. Provisional Patent Application No. 61/940,185 entitled AUDIO SYSTEM FOR REDUCTION AND/OR ELIMINATION OF DISTORTION, filed Feb. 14, 2014 in the name of Dennis McNutt, the disclosure of which is hereby incorporated herein by reference. This application is further related to a copending nonprovisional patent application entitled AUDIO SYSTEM AND METHOD FOR REDUCTION OF MICROPHONE DISTORTION, filed Feb. 13, 2015 in the names of Dennis McNutt, Dennis M. Kaloi and Richard A. Simon having application Ser. No. 14/622,805.

FIELD OF THE INVENTION

This invention relates generally to audio systems and more particularly to apparatus for elimination and/or reduction of audio distortion and errors introduced by audio recording, transmission or amplification systems.

BACKGROUND OF THE INVENTION

In many live performance venues such as musical performances, the music produced by musical instruments and voice performance are picked up by multiple microphones or sound pickups for amplification and distribution to the audience. The typical sound system may include a substantial network of preamplifiers, amplifiers, audio pickups, microphones, cables, connections and speakers. Many of these system components introduce distortion within the sound information such that the output sound from the speakers differs substantially from that which was originally produced by the musical instruments or singers.

Recording systems are subject to similar problems in that they employ many of the same amplifier and connecting network systems utilized in live performance. In addition, recording systems and recording studio systems may introduce additional types of distortion of the music or sound information which is produced by the recording and playback apparatus of the system.

In some performance venues, highly specialized and highly skilled audio technicians and/or audio engineers are brought in to "tune" and "adjust" many of the system components and the connecting networks utilized therein with the objective of eliminating or at least reducing audio distortions occurring within the systems. The use of audio technicians and audio engineers to set up an audio system prior to a performance is relatively inefficient, time consuming and expensive. Many performances and venues which host such performances are not able to accommodate or fund such exhaustive set up efforts. Often, musical performances and programs are changed from one performance to another requiring that at each performance or group of performances, different musicians and singers must be accommodated in the audio set up. Thus, the need to frequently set up to accommodate different instrument selection and musical arrangements makes the use of expensive and exhaustive audio set ups by audio technicians and audio engineers inefficient and impractical.

Within the scientific literature related to audio system design and analysis, a particular noise signal is analyzed which is generally referred to as "pink" noise. Additionally, practitioners also refer to pink noise as "flicker" noise. Pink noise is generally referred to as a 1/f type noise. Pink noise comprises a signal or process having a frequency spectrum such that the power spectral density (energy or power per Hz) is inversely proportional to the frequency of the signal. In pink noise, each octave (halving/doubling in frequency) carries an equal amount of noise power. The pink noise name arises from the pink appearance of visible light with this same power spectrum. In a more general scientific sense, the scientific literate more loosely defines pink noise to refer to any noise with a power spectral density of the form S(f)a(1/f to the power of a).

There arises therefore an unrealized need in the art for an improved system and apparatus for eliminating or at least reducing distortions of audio performances. There remains a further need in the art for improved systems and apparatus for eliminating or reducing distortions which are more cost effective, efficient and less time consuming.

SUMMARY OF THE INVENTION

Accordingly, it is a general object of the present invention to provide an improved audio system. It is a more particular object of the present invention to provide an improved audio system which eliminates or at least reduces audio distortion occurring in musical performances and the like. It is a still more particular object of the present invention to provide an improved system and apparatus for eliminating or reducing audio distortions which is readily accomplished by musicians without the aid of trained audio technicians and audio engineers.

Accordingly, the invention provides an audio system for reduction of distortion, the system comprising: an audio signal input; an amplifier coupled to the audio input and having an amplifier output; a speaker coupled to the amplifier output; a first configurable filter interposed between the audio signal input and the speaker; a speaker output detector receiving sound from the speaker and producing a corresponding electrical speaker signal; and a comparator coupled to the output detector and the audio signal input producing an error signal related to the difference therebetween and adjusting the first configurable filter in a distortion correcting manner.

In its operation, the present invention system provides a method, for configuring an audio system for reduced distortion, comprising the steps of: providing a musical instrument pickup constructed to produce music signals when a musical instrument is played; providing an audio system for amplifying the music signals and providing sound output from speakers and having first and second configurable filters; providing a source of pink noise signals defining a desired predetermined pink noise output characteristic; applying the pink noise signals to the audio system; detecting the audio system output produced in response to the applied pink noise signal; comparing the detected audio system output to the desired predetermined pink noise output characteristic; configuring the first configurable filter to cause the audio system output to conform to the predetermined pink noise output characteristic; providing a musical instrument reference signal applied to the audio system;

playing the musical instrument to cause the musical instrument pickup to play music through the audio system; detecting the audio system output produced by the instrument; comparing the audio system output produced by the instrument to the audio system output produced by the musical instrument reference signal; configuring the second configurable filter to cause the audio system output produced by the instrument to conform to that produced by the musical instrument reference signal; and playing the musical instrument through the audio system using the first and second configurable filters.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENTS

By way of overview, the present invention audio system for reduction and/or elimination of distortion provides a microphone or instrument sound pickup for the various musical instruments and singers within the performance venue. The sound provided by the microphone or audio pickup is coupled to an amplifier, the output of which is coupled to a speaker system. In accordance with the present invention, a microphone is positioned within the output range of the speaker system and is coupled to one input of a comparator circuit. The remaining input of the comparator circuit is coupled to the microphones or pickups of the musical instruments and singers. An additive device receives the output signal of the comparator and the originating signal from the microphones or pickups to form a correcting audio signal which is applied to the amplifier. In an alternate embodiment of the present invention, an adaptive preamplifier is interposed between the originating microphones and audio pickups and the amplifier. The adaptive preamplifier receives the output of the comparator and imposes alteration upon the signal processed through the preamplifier for application to the amplifier. In a still further alternate embodiment of the present invention, an adaptive amplifier includes a plurality of control elements which are capable of altering the transmission characteristic of the amplifier for the applied signals. The adaptive controls are coupled to and controlled by the comparator.

By way of further overview, the embodiments of the present invention system operate to utilize a sample of the originating sound produced by the musicians and singers together with a sample of the resulting output sound produced by the system's speakers to perform a comparison therebetween which in turn produces an error or distortion indicative signal. This error or distortion indicative signal is coupled to the adaptive portion of the system which configures the adaptive portion of the system and thereby implements an alteration or correction of the audio being applied to the amplifier in order to produce an output sound at the speakers which corresponds as closely as possible to the originating audio information. In this manner, distortion occurring within the audio system is eliminated or at least substantially reduced. The system may operate to provide a plurality of "presets" which are implemented on a pre-test basis or, alternatively, may operate dynamically in real time in a closed loop implementation. Both types of implementation are described below in greater detail.

Figure 1:
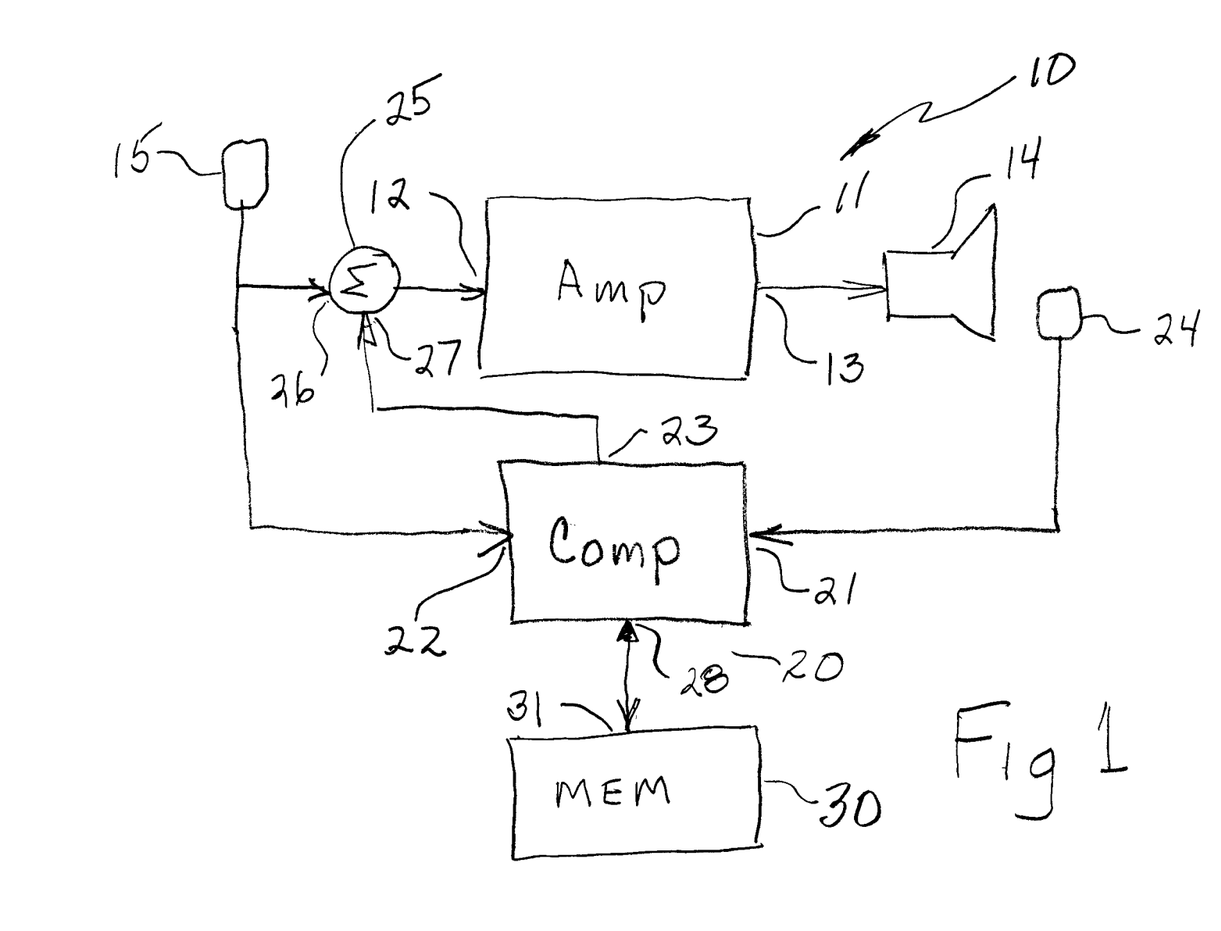
FIG. 1 sets forth a block diagram of the present invention audio system illustrating the basic system operation.

More specifically, FIG. 1 sets forth a generalized block diagram representation of the present invention audio system for reduction and/or elimination of distortion generally referenced by numeral 10. Audio system 10 includes an amplifier 11 having in input 12 and an output 13. System 10 further includes a speaker 14 coupled to output 13 of amplifier 11. System 10 further includes a comparator 20 having a pair of inputs 21 and 22 together with an output 23. Comparator 20 will be understood to include a digital signal processor together with convention circuitry for comparing inputs received at inputs 21 and 22 and producing a corresponding difference signal at output 23 of comparator 20. A memory 30 is operatively coupled to comparator 20 by a bidirectional connection between input/output 31 of memory 30 and input/output 28 of comparator 20. System 10 further includes a summing junction 25 having inputs 26 and 27. Input 27 is coupled to output 23 of comparator 20. An audio input 15 is coupled to input 26 of summing network 25 and to input 22 of comparator 20. A further audio input 24 is coupled to input 21 of comparator 20. Audio input 24 is positioned within the exposed output zone of speaker 14 and may comprise one or more conventional microphones or other types of audio sensors or pickups. Audio input 15 may comprise one or more conventional microphones or sound pickups of the type utilized in providing audio produced by conventional musical instruments and singers.

Amplifier 11 is of conventional fabrication and is operative to receive audio input at input 12 and process it to increase the power and volume thereof. The amplified or increased audio signal is applied at output 13 to speaker 14. In response to applied audio signals, speaker 14 operates in a conventional manner to produce audible energy which propagates outwardly from speaker 14. Audio sensor 24 which may comprise a conventional microphone or other suitable audio sensor is positioned within the anticipated energy output of speaker 14 and is coupled to input 21 of comparator 20. Audio sensor 15 which may comprise a conventional microphone or instrument audio pickup is coupled to input 26 of summing network 25 and to input 22 of comparator 20. Summing network 25 is operative to combine input audio input information at inputs 26 and 27 and to produce a corresponding combined signal output which is applied to input 12 of amplifier 11. Comparator 20 includes a digital signal processor (not shown) which cooperates with memory 30 via bidirectional connections 28 and 31.

In operation, input audio information is sensed by microphone 15 and applied to input 12 of amplifier 11 via summing network 25. In response, amplifier 11 increases or amplifies the applied signal and drives speaker 14 to produce audio output. This audio output of speaker 14 is sensed by sensor 24 to produce a second input signal to comparator 20 at input 21. Comparator 20 operates under the control of an internal digital signal processor in cooperation with a stored memory set or program within memory 30 to compare the input signals at inputs 21 and 22 and produce a corresponding difference signal often referred to as an "error signal". The essential property of this error signal is that it constitutes a signal with represents the difference between the original audio information sensed by microphone 15 and the enhanced amplified audio information from speaker 14 sensed by microphone 24. Stated simply, the error signal produced by comparator 20 represents the difference or change in the instrumental or vocal music between the input and output of system 10. This difference constitutes the distortion or error produced within system 10.

In accordance with an important aspect of the present invention, the error signal produced by comparator 20 and applied to summing network 25 in a phase and polarity which provides a correction signal or distortion reduction signal which, when combined with the originating audio information sensed by microphone 15 changes the input signal at input 12 of amplifier 11 in a manner which in turn causes the output audio energy produced by speaker 14 to be reduced in distortion and errors. Thus, the output signal of comparator 23 is corrective in its phase and application and when combined within summing network 25 alters the originating audio information in a manner which reduces distortion and error in the sensed output of speaker 14.

Figure 2:
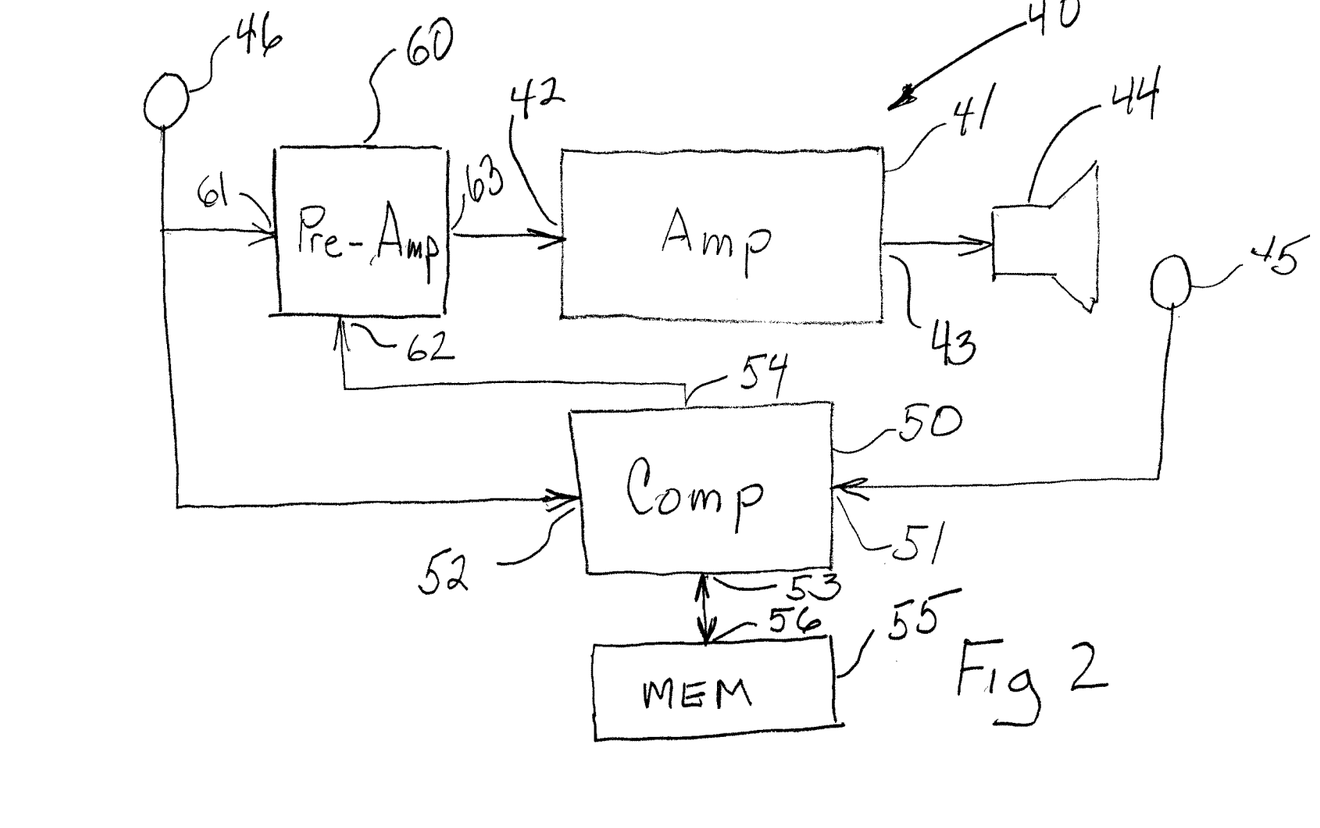
FIG. 2 sets forth a block diagram of an embodiment of the present invention audio system which utilizes a variable preamplifier for parameter correction within the audio system.
Figure 3:
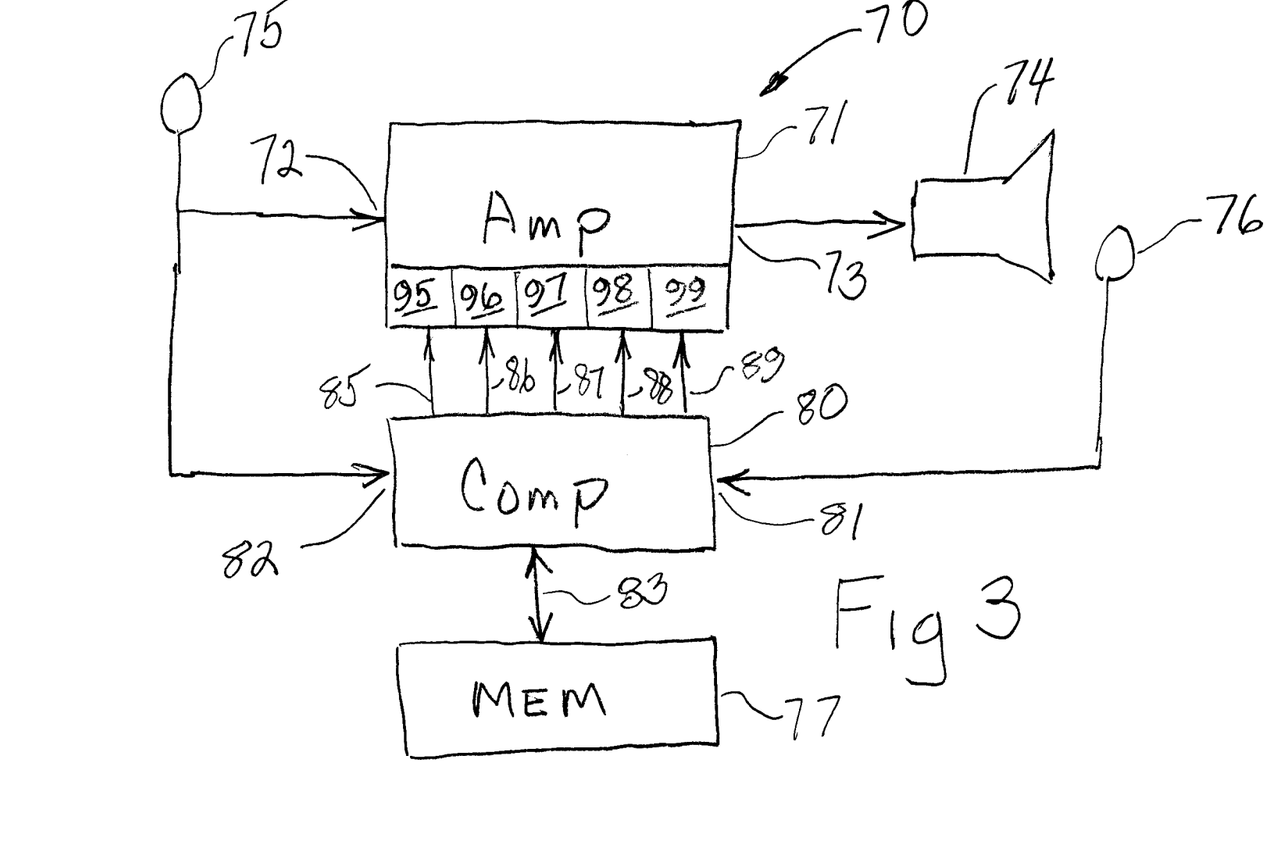
FIG. 3 sets forth a block diagram of a further alternate embodiment of the present invention audio system which utilizes an amplifier having transfer characteristic control within the amplifier itself.

Thus, the simplified illustration of the present invention audio system shown in FIG. 1 will be seen to provide the basic operation which reduces distortion and errors within the audio system. This operation in essence provides that the input or originating audio is compared to the resulting output audio to create a signal indicating the difference there between. The difference between the original input audio information and the output of the system is indicative of distortion and thus the error signal is applied in a manner which is basically "corrective" in that the effect of the error signal is to cause the audio system to adjust so as to reduce or eliminate the distortion or error produced in the system. Ideally, the distortion or error produced by the system would be brought to zero and thus the input originating audio and the output audio would be substantially identical and the different signal would approach zero. FIGS. 2 and 3 (described below) set forth more detailed embodiments of the present invention and are illustrative of system operation in a static or "preset" configuration as well as a real-time closed-loop operation. In each of the systems described below in FIGS. 2 and 3, the example of a double bass musical instrument will be utilized. However, it will be apparent to those skilled in the art that the present invention system is equally applicable and equally advantageous in other musical instruments such as guitar or wind instruments as well as vocal music without departing from the spirit and scope of the present invention. In the examples which follow below in FIGS. 2 and 3 which, as mentioned, utilize a double bass for illustration, but not limitation, the possible distortions of the type which frequently occur in amplifying systems such as variation of pitch or fundamental note, variation in the amount or percentage of sub harmonics as well as harmonics in the double bass musical production. Additionally, the examples which follow will also discuss an illustrative source of distortion which are induced by the acoustic characteristics of the performance venue. Typically such environmentally induced distortions are caused by node or antinode effects at a given frequency or set of frequencies within the music. Essentially, such effects are created when the shape, size and character of the performance environment create effects which alter the proportionate amount of audio energy at a given frequency or pitch.

FIG. 2 sets forth a block diagram of an alternate embodiment of the present invention generally referenced by numeral 40. Audio system 40 includes an amplifier 41 having an input 42 and an output 43. System 40 further includes a speaker 44 coupled to output 43 of amplifier 41. A comparator 50 includes a pair of inputs 51 and 52 together with an output 54. A memory 55 is coupled to comparator 50 by a bidirectional coupling between input/output 56 of memory 55 and input/output 53 of comparator 50. Audio system 40 further includes a preamplifier 60 having an input 61 and an output 63. Output 63 of preamplifier 60 is coupled to input 42 of amplifier 41. Output 54 of comparator 50 is coupled to input 62 of preamplifier 60. A microphone or audio pickup 46 is coupled to input 61 of preamplifier 60 and to input 52 of comparator 50. A microphone 45 is positioned within the propagation area of speaker 45 and is operatively coupled to comparator 50 at input 51 thereof.

In operation, audio system 40 is operative in accordance with the present invention to provide system function in either a static or "preset" operation or alternatively in a closed loop real time operation. In addition, the present invention system may be initially set up using the preset or static mode and thereafter operated in the closed loop real time mode.

Both modes of operation of audio system 40 utilize the basic principle of operation set forth above in FIG. 1 in that a comparison is made between the originating audio information and the resulting audio output from system 40 to produce an error signal which is used to influence the characteristics of system 40 such that the system output more closely resembles or conforms to the originating audio information. Simply stated, the system works to eliminate or substantially reduce the distortion created within system 40 by causing the output of system 40 to be as close as possible to the originating input audio.

When operated in a static or preset mode, the user employing for example a double bass plays a succession of predetermined "sample" tones, the sample tones are sensed by microphone 46 to produce corresponding audio information which is concurrently applied to input 61 of preamplifier 60 and input 52 of comparator 50. The applied audio information is conditioned by preamplifier 60 and applied to input 42 of amplifier 41. This preconditioning may for example include the introduction of appropriate high pass and low pass filters to reduce the noise content of the originating audio information. Amplifier 41 increases the power of the preconditioned audio information to a level sufficient to drive speaker 44. In response, speaker 44 propagates audible sound which is sensed by microphone 45 producing an input signal at input 51 of comparator 50. Comparator 50 receives the originating signal from microphone 46 and the resulting output audio from microphone 45 and carries forward a comparison of each of the sampled tones. If sources of distortion are present within audio system 40, a difference between the sensed originating audio and the sensed output audio exists and is converted by comparator 50 to a difference or error signal at output 54. This difference or output signal is applied at input 62 to preamplifier 60. Preamplifier 60 is fabricated to include apparatus (not shown) for altering the transfer characteristic of the preamplifier in response to the signal at input 62. Thus, in the illustrative example of a double bass preamplifier 60 may include apparatus responsive to the different signal produced by comparator 50 to alter the pitch of audio which it transfers to amplifier 41. This pitch represents the fundamental frequency of the double bass sample tones and should any resulting frequency difference be imposed upon the sample tones by system 40, preamplifier 60 is configured to alter the pitch of its out signal in a correcting or compensating direction. Similarly, in the event a distortion within system 40 changes the proportional content of harmonic information or sub harmonic information, preamplifier 60 responds to the resulting difference signal produced by comparator 50 to introduce a compensating or correcting increase or decrease in the transfer characteristic of the harmonic or sub harmonic information. Once the sample tones played through system 40 by the user have been compared to the originating tones and presets of preamplifier 60 implemented, the system then utilizes these presets to adjust or compensate the overall characteristic of system 40 so as to generally reduce distortion occurring within the system. An alternative operation for the preset or static mode allows the user to store standard sample tones within memory 55 which are used by comparator 50 to establish the presets within preamplifier 60. Ideally, the user in establishing the presets for the system using the above-described sample tone method employs sample tones which represent the anticipated range of tones to be produced by the double bass instrument.

As mentioned above, the present invention audio system may also be utilized in a closed loop real time configuration. In contrast to the above-described static or preset type of utilization of the present invention system, closed loop real time operation maintains a dynamic corrective action during the actual performance. Thus, as the illustrative double bass (not shown) is utilized in a performance, the corresponding audio information is picked up by microphone 46 and applied to preamplifier 60. Preamplifier 60 produces an output signal which is boosted by amplifier 41 to drive speaker 44. The output of speaker 44 is sensed by microphone 45 and the two microphone signals are applied to inputs 51 and 52 of comparator 50. Comparator 50 produces a difference signal indicative of the differences between the originating audio and the output audio and applies the difference signal in real time to input 62 of preamplifier 60. Within preamplifier 60, one or more corrective transfer circuits are operative in response to the difference signal applied. If for example, a difference in pitch is sensed by comparator 50, preamplifier 60 responds to the resulting error signal by altering the pitch of audio information applied to amplifier 40 which shifts the resulting pitch of amplified signal driving speaker 44 in a compensating direction. Similarly, in the event the harmonic content within the output signal of speaker 44 is incorrectly proportioned to the remaining audio information, comparator 50 produces an error signal which is applied to preamplifier 60 in a manner correcting the proportion or amount of harmonic or sub harmonic information in the audio until the resulting audio information sub harmonic and harmonic content propagated from speaker 44 is corrected. In contrast to the preset or static operation described above, the real time closed loop operation maintains virtually instantaneous control of the transfer characteristics of preamplifier 60 in order to eliminate or reduce the resulting distortion in the output of speaker 44.

It will be apparent to those skilled in the art that while a double bass is selected for illustration in the above descriptions, the present invention system is equally well applied to other musical instruments or vocal music without departing from the spirit and scope of the present invention. It will be equally apparent to those skilled in the art that while distortions occurring in pitch and harmonic or sub harmonic content within the system are selected for illustration, the present invention system is operative with equal effectiveness in controlling or reducing other types of distortions without departing from the spirit and scope of the present invention.

FIG. 3 sets forth a block diagram of a further alternate embodiment of the present invention audio system for reduction and/or elimination of distortion generally referenced by numeral 70. Comparison of FIGS. 2 and 3 shows that system 70, shown in FIG. 3, is generally the same as system 40, shown in FIG. 2, with the difference being primarily found in the manner of implementing distortion correction. As described above, system 40 utilizes a processor-controlled preamplifier 60 interposed between microphone 46 and amplifier 41 to effect correction to the audio signals applied to amplifier 41. In contrast, system 70, shown in FIG. 3, utilizes a plurality of computer-controlled amplifier setting 95 though 99 to implement corrective adjustments to the audio signals applied to amplifier 71. Despite these differences, however, It will be apparent to those skilled in the art that both systems are operative to use the differences between originating music and amplified output music to make corrective changes to the system processing to compensate for, and eliminate, distortion errors introduced by the audio system. In both modes of operation, comparator 80 responds to the difference between the originating music, sensed by microphone 75 and the output music, sensed by microphone 74 to produce difference signals that are applied to adjustments 95 through 99 in order to alter the transfer characteristic of amplifier 71 and reduce distortion.

More specifically, FIG. 3 shows audio system 70 having an amplifier 71 which in turn includes a plurality of computer controllable transfer characteristic adjustments 95 through 99 built into amplifier 71. Amplifier 71 further includes an input 72 and an output 73. System 70 also includes a microphone 75 coupled to input 72 of amplifier 71 and a speaker 74 coupled to output 73 of amplifier 71. A comparator 80, which will be understood to include a digital signal processor (not shown), includes an input coupled to microphone 75 and an output 81. A plurality of difference signal outputs 85 through 89 are coupled to adjustments 95 through 99 respectfully. Comparator 80 is further coupled to a memory 77 by a bi-directional link 83. System 70 also includes a microphone 74 positioned in the propagation path of speaker 74 which is coupled to input 81 of comparator 80.

In operation, system 70 may be utilized in either the preset mode or static mode, described above or in the closed loop real time mode also described above. In addition, the present invention system may be initially set up using the preset or static mode and thereafter operated in the closed loop real time mode.

In a similar manner to the operation of system 40, described above, when system 70 is operated in a static or preset mode, the user employing for example a double bass plays a succession of predetermined "sample" tones, the sample tones are sensed by microphone 75 to produce corresponding audio information which is concurrently applied to input 72 of amplifier 71 and input 82 of comparator 80. Comparator 80 receives the originating signal from microphone 75 and the resulting output audio from microphone 76 and carries forward a comparison of each of the sampled tones. If sources of distortion are present within audio system 70, a difference between the sensed originating audio and the sensed output audio exists and is converted by comparator 80 to a plurality of difference or error signals at outputs 85 through 89. The difference signals are applied at inputs 95 through 99 of amplifier adjustments 85 though 89 respectively. As mentioned, amplifier 70 includes apparatus (not shown) for altering the transfer characteristics of the amplifier in response to the signal inputs. Thus, in the illustrative example of a double bass amplifier 70 may include apparatus responsive to the different signals produced by comparator 80 to alter the pitch of audio which it applies to speaker 74. This pitch represents the fundamental frequency of the double bass sample tones and should any resulting frequency difference (distortion) be imposed upon the sample tones by system 70, amplifier 70 is configured to alter the pitch of its out signal in a correcting or compensating direction. Similarly, in the event a distortion within system 70 changes the proportional content of harmonic information or sub harmonic information, amplifier 70 responds to the resulting difference signal produced by comparator 80 to introduce a compensating or correcting increase or decrease in the transfer characteristic of the harmonic or sub harmonic information. Once the sample tones played through system 70 by the user has been compared to the originating tones and presets of amplifier 71 implemented, the system then utilizes these presets to adjust or compensate the overall characteristic of system 70 so as to generally reduce distortion occurring within the system. As in the operation of system 40 (shown in FIG. 2) an alternative operation for the preset or static mode allows the user to store standard sample tones within memory 77 which are used by comparator 80 to establish the presets within amplifier 71. Ideally, the user in establishing the presets for the system using the above-described sample tone method employs sample tones which represent the anticipated range of tones to be produced by the double bass instrument.

As mentioned above, the present invention audio system may also be utilized in a closed loop real time configuration. As is also mentioned above, closed loop real time operation maintains a dynamic corrective action during the actual performance. Thus, as the illustrative double bass (not shown) is utilized in a performance, the corresponding audio information is picked up by microphone 75 and applied to amplifier 71 which produces an output signal to drive speaker 74. The output of speaker 74 is sensed by microphone 76 and the two microphone signals are applied to inputs 81 and 82 of comparator 80. Comparator 80 produces a plurality of difference signals indicative of the differences between the originating audio and the output audio and applies the difference signal in real time to inputs 95 through 99 of amplifier 71. Within amplifier 71, one or more corrective transfer circuits are operative in response to the difference signals applied.

If for example, a difference in pitch is sensed by comparator 80, the appropriate adjuster within amplifier 71 responds to the resulting error signal by altering the pitch of audio information applied to speaker 74 in a compensating direction. Similarly, in the event the harmonic content within the output signal of speaker 74 is incorrectly proportioned to the remaining audio information, comparator 80 produces an error signal which is applied to the appropriate adjuster within amplifier 71 in a manner correcting the proportion or amount of harmonic or sub harmonic information in the audio until the resulting audio information sub harmonic and harmonic content propagated from speaker 74 is corrected. In contrast to the preset or static operation described above, the real time closed loop operation maintains virtually instantaneous control of the transfer characteristics of amplifier 71 in order to eliminate or reduce the resulting distortion in the output of speaker 74.

Figure 4:
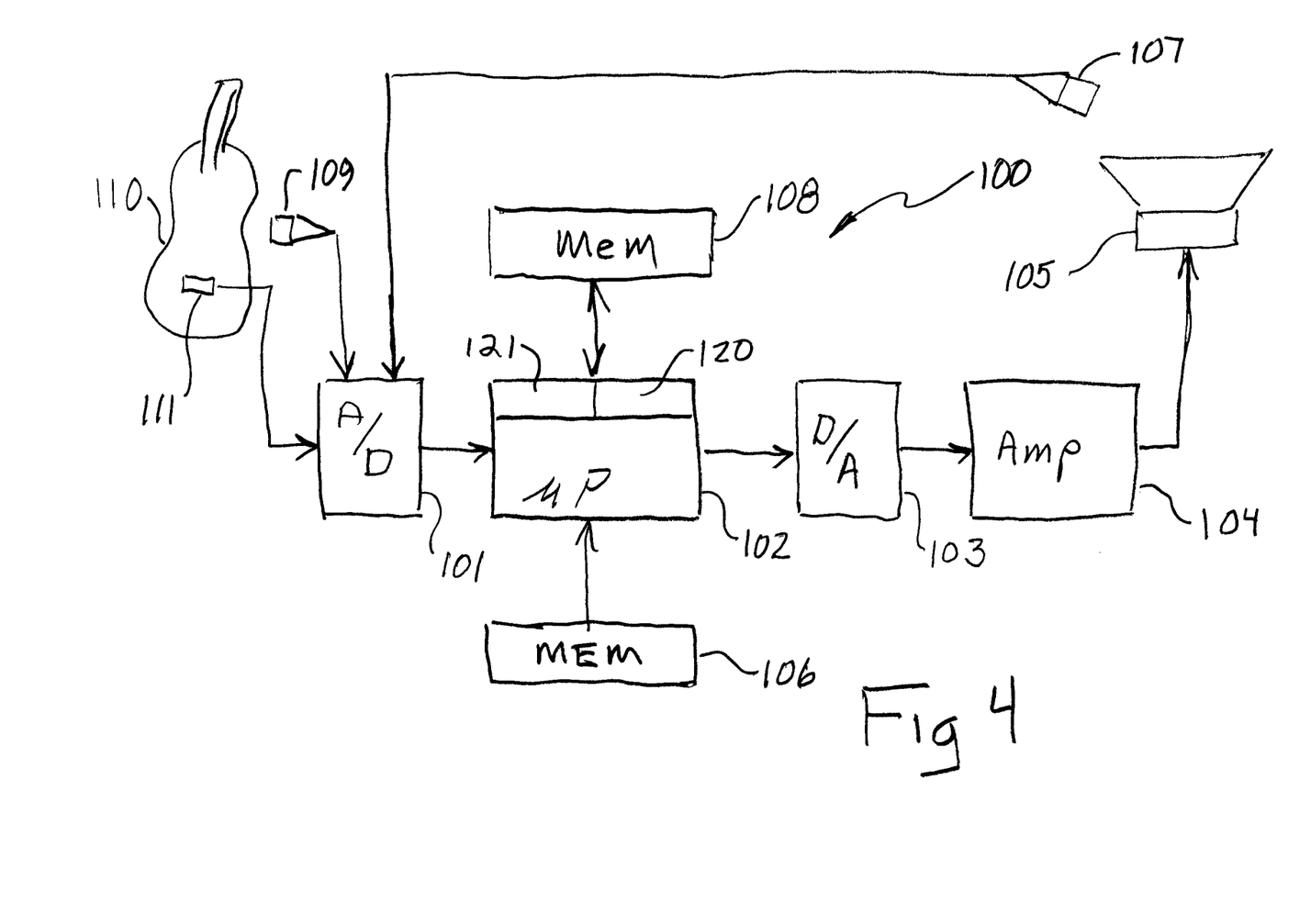
FIG. 4 sets forth a block diagram of a further alternate embodiment of the present invention audio system which uses pink noise injection.

FIG. 4 sets forth a block diagram representation of a still further alternate embodiment of the present invention audio system for reduction and/or elimination of distortion generally referenced by numeral 100. Audio system 100 includes a microprocessor 102 having an associated memory 108 operatively coupled thereto. A flash memory 106 is also coupled to microprocessor 102. Audio system 100 further includes an input analog to digital converter 101 and an output digital to analog converted 103. The output of digital to analog converter 103 is further coupled to an amplifier 104 which in turn is coupled to a speaker 105. A microphone 107 is positioned to receive acoustic energy produced by speaker 105. Microphone 107 is coupled to an analog to digital converter 101. System 100 further includes a microphone 109 coupled to analog to digital converter 101 and a musical instrument pickup 111. Pickup 111 is coupled to a conventional musical instrument bass 110.

It will be apparent to those skilled in the art that the system components utilized within audio system 100 are of conventional fabrication. Accordingly, it will also be realized that a variety of equivalent devices for the operative components shown in system 100 may be utilized without departing from the spirit and scope of the present invention. For purposes of illustration, it will be noted that in the operative environment shown in FIG. 4, microprocessor 102 may, for example, comprise a processor manufactured by Analog Devices having part number ADSP-BF537KBCZ. Additionally, flash memory 106 may comprise a memory manufactured by Spansion having part number S29GL032N90 TF1020. Microprocessor memory 108 which may utilize either a RAM or DRAM memory manufactured by Micron having part number MT48LC16M16A2P. Digital to analog converter 103 may comprise a converter or CODEC having an internal digital to analog converter manufactured by Analog Devices having part number AD1953. Amplifier 100 may comprise an amplifier manufactured by Texas Instruments having part number TAS5412PHD. Musical instrument pickup 111 as well as microphones 107 and 109 may utilized standard conventional components readily available in the market.

Microprocessor 102 and memory 108 cooperate to provide a capability within microprocessor 102 by which signals applied to the input of the processor may be transferred to the processor output having been subjected to one or more software filters housed within microprocessor 102. For purposes of illustration, microprocessor 102 is shown having a first software filter 120 and a second software filter 121 constructed and configured within microprocessor 102. Digital to analog converter 103 is conventional in fabrication and operation and converts the digital signal output of microprocessor 102 to a corresponding analog signal which is amplified by amplifier 104 and applied to speaker 105. Amplifier 104 provides sufficient power to drive speaker 105 and produce the desired sound output for use within the host venue. Microphone 107 is positioned to be stimulated by the sound output of speaker 105 and produces electrical signals corresponding to the received sound output. These signals are analog in character and are coupled to analog to digital converter 101. Converter 101 converts the applied analog signals from microphone 107 to corresponding digital signals which are applied to the input of microprocessor 102. As mentioned above, microprocessor 102 is operative to impose either or both of the filter characteristics of filters 120 and 121 to the signal coupled through microprocessor 102.

System 100 further includes a microphone 109 which is coupled to analog to digital converter 101 and is positioned to be stimulated by sound output directly from a musical instrument such as bass 110. Bass 110 further includes a conventional sound pickup 111 coupled to bass 110, the output of which is applied to analog to digital converter 101. Flash memory 106 provides a stored file set which correspond to the above-described pink noise signal. Memory 106 couples the pink noise signals to an input of microprocessor 102.

In the preferred fabrication and utilization of the present invention audio system and method, reducing and/or eliminating distortion is carried forward in two operational phases. In the first phase, microphone 109 and pickup 111 are initially deactivated or decoupled from analog to digital converter 101. This may comprise an actual opening of the connections to converter 101 or, alternatively, turning the devices off. In either event, during this initial first phase operation, no input is provided to analog to digital converter 101 by microphone 109 or pickup 111. Under these conditions, a pink noise signal, which may be either internally stored within microprocessor 102 or received from flash memory 106, is applied to microprocessor 102. Microprocessor 102 then couples the pink noise signal to digital to analog converter 103 which in turn produces a corresponding analog pink noise signal. This pink noise signal is amplified by amplifier 104 driving speaker 105 and producing a pink noise audio output. The pink noise audio output is sensed by microphone 107 which produces an analog pink noise signal. The pink noise analog signal is converted back to a digital pink noise signal by converter 101 applied to microprocessor 102.

In evaluating the returning pink noise signal, microprocessor 102 makes use of one of the important properties of pink noise. This property involves the industry establishment of a standardized predictable pink noise output response. In other words, practitioners in the audio system arts have provided a desired resulting characteristic to be exhibited by a system which has been subjected to pink noise. This desired response simplifies the determination of the distortion level within an audio system. Thus, in the present invention system, this desired output response to the applied pink noise signal may be used as a reference by processor 102 to configure the filter characteristics of software filter 120 such that the resulting signal exhibits the desired pink noise response.

Accordingly, microprocessor 102 performs a comparison of the resulting return pink noise signal, which has been distorted by audio system 100, to the established pink noise response characteristic. The differences between the returning pink noise signal and the industry standard response are used by processor 102 to configure software filter 120 and provide appropriate corrective filter characteristics. The function of filter 120 is to restore the distorted returning pink noise signal to the desired response.

The processing of audio system 100 may perform a single evaluation and filter configuration, or alternatively, may utilize iterative processing in which repeated processing cycles are carried out to refine filter 120 and provide error compensation for the signal loop formed by analog to digital converter 101, microprocessor 102, digital to analog converter 103, amplifier 104, speaker 105 and microphone 107. Once this compensation has been achieved and software filter 120 is correctly configured for the above system loop, distortion and error compensation for the entirety of audio system 100 may be obtained by including microphone 109 and pickup 111 in the system operation.

Once the initial system loop evaluation and distortion correction using pink noise has been performed in the above-described first phase, instrument pickup 111 is activated and operatively connected to analog to digital converter 101 in order to carry forward the second phase of reducing and/or eliminating distortion. The object of the second phase of system correction is to play a set of musical instrument signals using an instrument, in this case bass 110, through audio system 100 and to compare the sound output produced by speaker 105 to reference bass signals. For this phase the reference bass signals may be provided by a set of standard bass signals stored in microprocessor 102, memory 108 or memory 106. Alternatively, the reference bass signals may be provided by connecting and activating microphone 109. In either event, bass 110 is played to provide input to analog to digital converter 101. This input, which may for example comprise a series of distinct chords, passes through converter 101, microprocessor 102, converter 103, amplifier 104 producing sound emanating from speaker 105. The latter is sensed by microphone 107 providing return signals to microprocessor 102 via converter 101. Microprocessor 102 compares the returning signals to the reference signals and configures software filter 121 to provide the appropriate filter characteristics for eliminating distortion.

During the second phase of system configuration, that is to say configuration of software filters 120 and/or 121, error corrections are provided using the music produced by musical instruments rather than generated pink noise signals. While this error correction may be used as mentioned above as the second phase of overall system correction, it may also be used independently to establish convenient stored reusable filter values tagged for a given instrument and preamplifier combination in future use.

More specifically, with continued reference to FIG. 4, a bass 110 is used as the instrument under test. It will, however, be apparent to those skilled in the art that virtually any instrument or voice may be used. Bass 110 may be either bowed or picked to produce a note on a selected string thereof. For purposes of illustration, it will be assumed that the strings of bass 110 are bowed to produce each string note in the descriptions that follow. The system configuration shown in FIG. 4 provides a direct originating sound using microphone 109, a pickup sound using pickup 111 and an output sound using microphone 107 for each note played on bass 110. Initially, a note is produced by bowing one of the strings of bass 110. The pickup sound of pickup 111 and direct originating sound of microphone 109 are stored in memory. Thereafter, the pickup sound is played through system 100 and the output sound at microphone 107 is compared to the stored originating sound. An error correction factor is then calculated and is stored. This process is repeated for each bass string to provide error corrections for each string of bass 110. The error corrections of all strings are then averaged to provide an average error correction. The average error correction factor is then used to configure software filters 120 and 121, alone or in combination, to configure the system. The average error correction factor and/or the resulting filter configuration may be stored and used again in combination with bass 110 and amplifier 104 in future venues and occasions.

Once the first and second phases of system configuration have been completed, processor 102 applies filters 120 and 121 to the signals originating at bass 110 producing output sound at speaker 105 which are substantially free of distortion. If the reference bass used in the second phase is a stored set of bass signals, the sound output at speaker 105 will closely correspond to the standard bass output. If, on the other hand, the reference bass signals are provided by the direct sound pickup of microphone 109, the output sound at speaker 105 will closely correspond to the actual sound produced by bass 110 as it is played.

Figure 5:
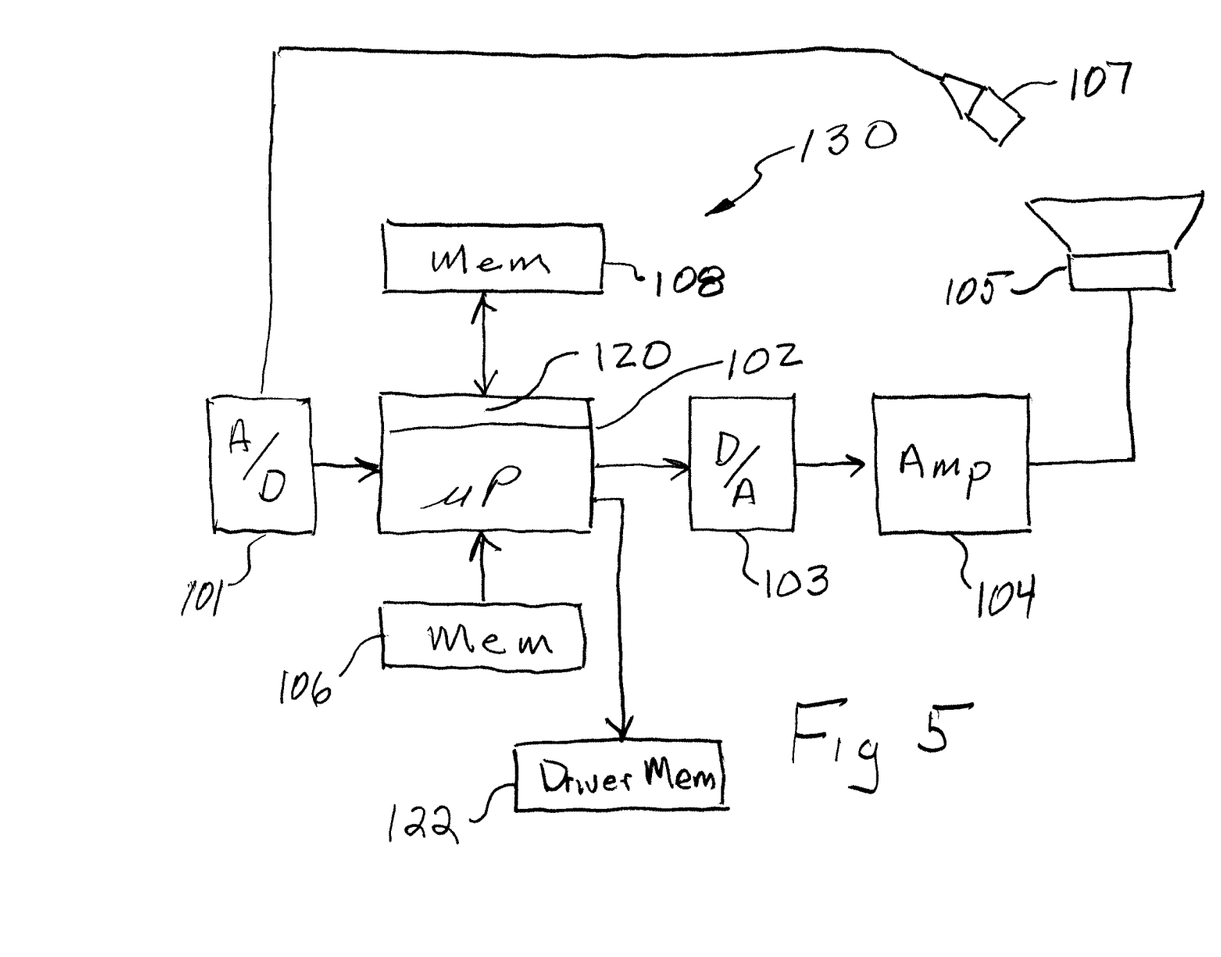
FIG. 5 sets forth a block diagram of a still further alternate embodiment of the present invention audio system directed toward microphone correction.

FIG. 5 sets forth a block diagram representation of a still further alternate embodiment of the present invention audio system for reduction and/or elimination of distortion generally referenced by numeral 130. Audio system 130 includes a microprocessor 102 having an associated memory 108 operatively coupled thereto. A flash memory 106 is also coupled to microprocessor 102. Audio system 130 further includes an input analog to digital converter 101 and an output digital to analog converted 103. The output of digital to analog converter 103 is further coupled to an amplifier 104 which in turn is coupled to a speaker 105. A microphone 107 is positioned to receive acoustic energy produced by speaker 105. Microphone 107 is coupled to an analog to digital converter 101. System 130 further includes a driver memory 122 coupled to processor 102.

System 130 is similar to system 100, described above, in that it includes processor 102 coupled to converters 101 and 103. Also, system 130 includes amplifier 104 driving speaker 105. System 130 differs from system 100 in that the operation is directed toward creating and providing a set of drivers which are subsequently used to configure other audio systems in a manner that compensates for distortions caused by microphone 107. In other words, system 130 provides a system that may be used to improve the performance of microphones. In the anticipated use of system 130, the above-described pink noise process is carried forward to derive filter characteristics using pink noise for reducing distortion. However, in the preferred operation of system 130, the filter characteristics, once derived, are transferred to driver memory 122 which are used by users employing microphone 107. It will be apparent to those skilled in the art that driver memory may utilize a disk memory, flash drive or virtually any type of memory without departing from the spirit and scope of the present invention. In addition, it will be recognized that direct transfer, such as email, may also be used. Thus, purchasers of a microphone simply install the filter characteristics derived for their microphone into any audio system in which the microphone is used.

In operation, a microphone is installed as shown by microphone 107 in FIG. 5. Thereafter, a pink noise signal, which may be either internally stored within microprocessor 102 or received from flash memory 106, is applied to microprocessor 120. Microprocessor 102 then couples the pink noise signal to digital to analog converter 103 which in turn produces a corresponding analog pink noise signal. This pink noise signal is amplified by amplifier 104 driving speaker 105 and producing a pink noise audio output. The pink noise audio output is sensed by microphone 107 which produces an analog pink noise signal. The pink noise analog signal is converted back to a digital pink noise signal by converter 101 applied to microprocessor 102.

Microprocessor 102 performs a comparison of the resulting return pink noise signal, which has been distorted by microphone 107, to the established pink noise response characteristic. The differences between the returning pink noise signal and the industry standard response are used by processor 102 to configure software filter 120 and provide appropriate corrective filter characteristics. The corrective filter characteristics within filter 120 are the transferred to driver memory 122. Microphone 107 and driver memory 122 are the provided to a customer or other user.

The processing of audio system 100 may perform a single evaluation and filter configuration, or alternatively, may utilize iterative processing in which repeated processing cycles are carried out to refine filter 120 and provide error compensation for the signal loop formed by analog to digital converter 101, microprocessor 102, digital to analog converter 103, amplifier 104, speaker 105 and microphone 107. Once this compensation has been achieved and software filter 120 is correctly configured for the above system loop, distortion and error compensation for the entirety of audio system 100 may be obtained by including microphone 109 and pickup 111 in the system operation.

Figure 6:
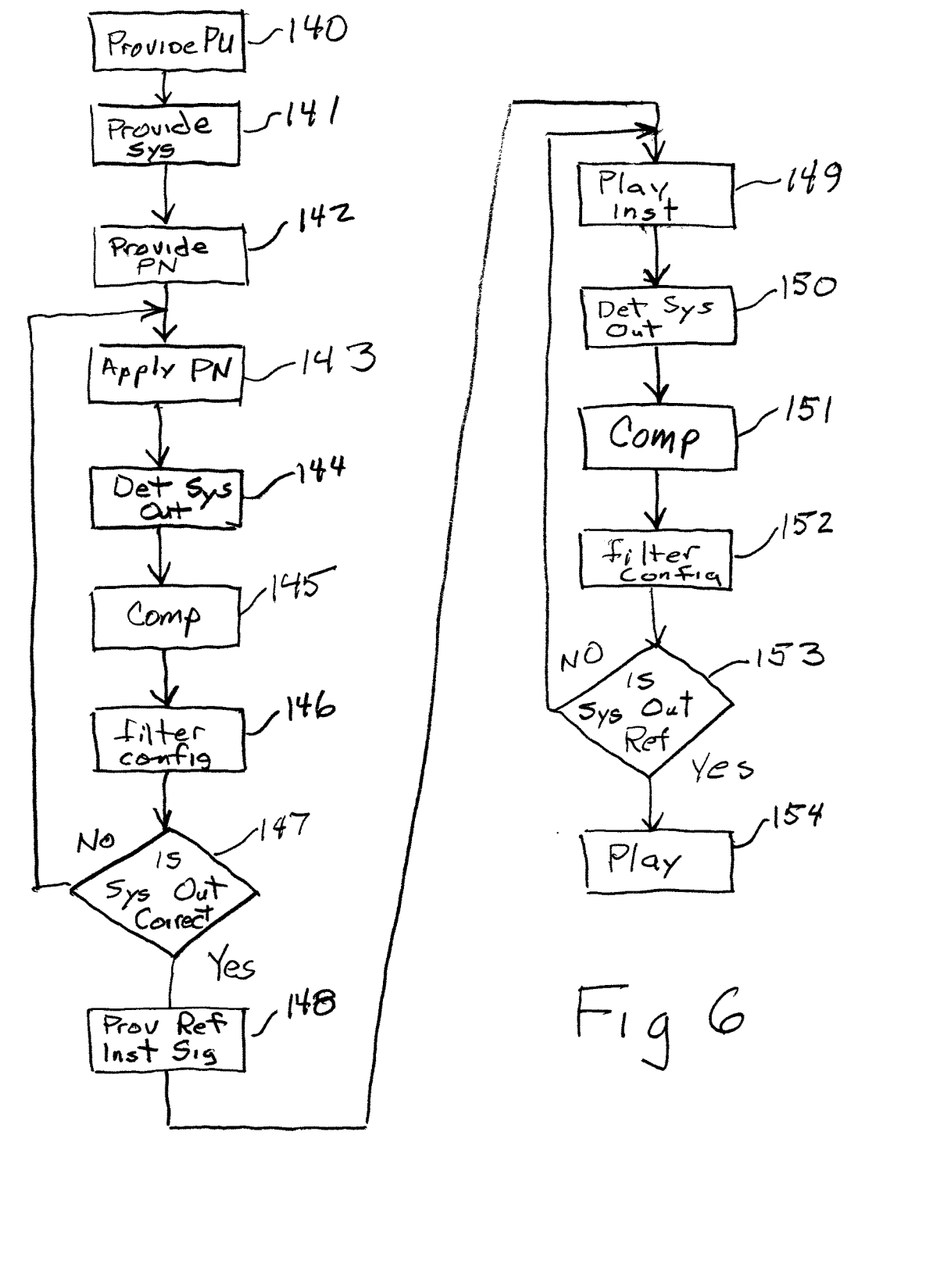
FIG. 6 sets forth a flow diagram of the present invention method of reduction and/or elimination of distortion.

FIG. 6 sets forth a flow diagram of the present invention method of reduction and/or elimination of distortion in an audio system. It will be recalled from the above descriptions of the present invention that system operation is carried forward in a first phase and a second phase. In the flow diagram of FIG. 6, the first phase corresponds to method steps 140 through 147 while the second phase corresponds to method steps 148 through 153.

More specifically, and with continuing reference to FIG. 6, the present invention method begins at a step 140 in which a musical instrument having an instrument pickup is provided. At step 141 an audio system for amplifying music and driving speakers having first and second configurable filters is provided. At step 142, a source of pink noise is provided. At step 143, pink noise is applied to the audio system and at step 144 the output pink noise is detected to produce a returning pink noise signal. At step 145, the returning pink noise signal is compared to a predetermined pink noise signal. At step 146, the audio system first filter is configured to correct differences between the returning pink noise signal and the predetermined pink noise signal. At step 147, the system determines whether the returning pink noise signal is corrected. If corrected, the system moves to step 148, if not corrected, the system returns to step 143.

At step 148, a reference instrument signal is provided. At step 149, the musical instrument is played. At step 150, the music produced by the musical instrument is detected and at step 151 is compared to the reference instrument signal. At step 152 the second filter is configured. At step 153, a determination is made whether the detected musical instrument signal conforms to the reference signal. If the signal conforms, the system moves to step 154 and the musical instrument is played, if not, the system returns to step 149.

Figure 7:
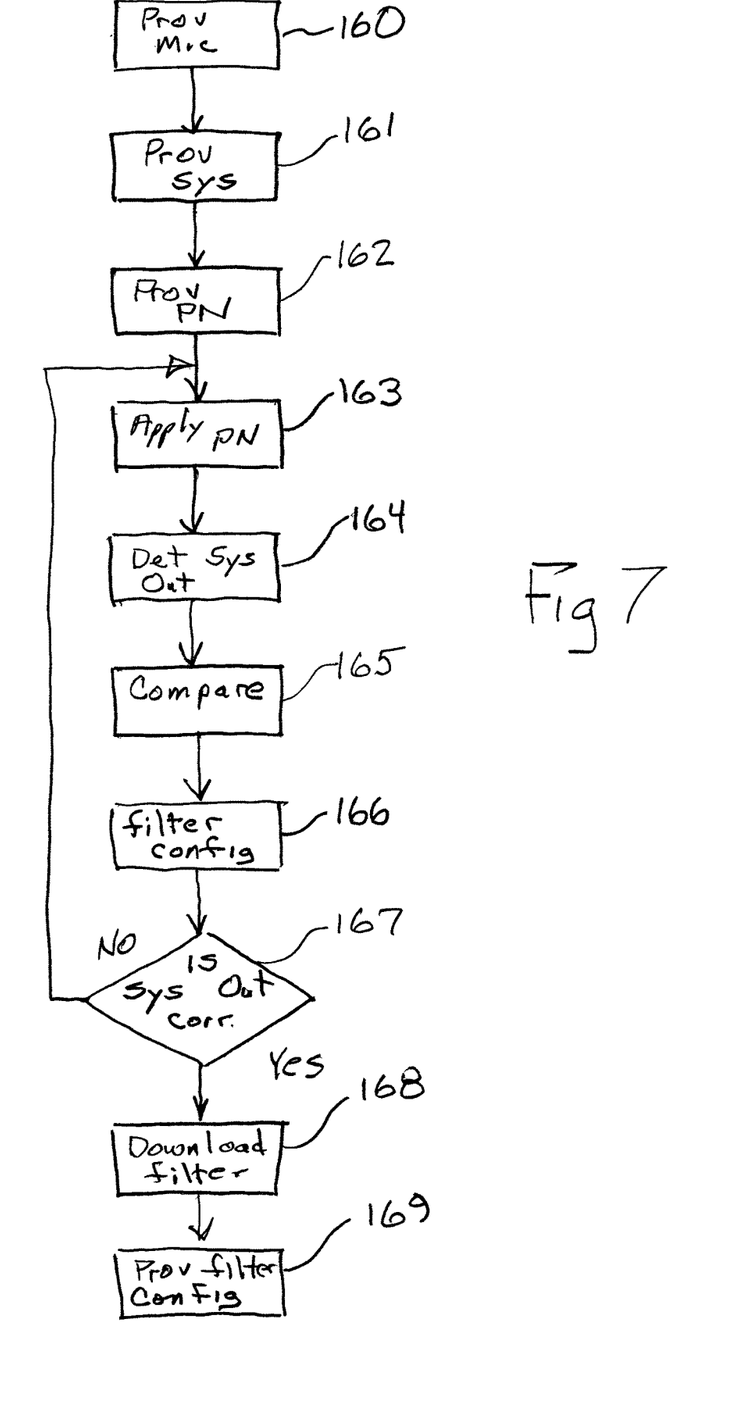
FIG. 7 sets forth a flow diagram of a further method of reduction and/or elimination of distortion.

FIG. 7 sets forth a flow diagram of the present invention method of reduction and/or elimination of distortion in an audio system directed to creating and providing a set of drivers which are subsequently used to configure other audio systems in a manner that compensates for distortions caused by microphone. The present invention method begins at a step 160 in which a microphone is provided. At step 161 an audio system for amplifying music and driving speakers having a configurable filter is provided. At step 162, a source of pink noise is provided. At step 163, pink noise is applied to the audio system and at step 164 the output pink noise is detected to produce a returning pink noise signal. At step 165, the returning pink noise signal is compared to a predetermined pink noise signal. At step 166, the audio system filter is configured to correct differences between the returning pink noise signal and the predetermined pink noise signal. At step 167, the system determines whether the returning pink noise signal is corrected. If corrected, the system moves to step 168, if not corrected, the system returns to step 163. At step 168, the configurable filter information is stored in memory or transferred via email. At step 169, the stored configurable filter information is provided to the microphone user.

What has been shown is a novel audio system for reducing or eliminating distortion by comparing the originating music to the system output music to develop an error signal used to correct the transfer characteristic of the audio system. The inventive system is operable in a preset, or static mode as well as a dynamic closed loop real time mode.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. An audio system operable in a closed loop condition for establishing a preset transfer characteristic used for reduction of distortion when said system is operated in an open loop condition, said system comprising:
    an audio signal input;
    an amplifier coupled to said audio input and having an amplifier output;
    a speaker coupled to said amplifier output;
    a first configurable filter interposed between said audio signal input and said speaker imposing a transfer characteristic upon audio signals between said audio signal input and said speaker;
    a speaker output detector receiving sound from said speaker and producing a corresponding electrical speaker signal;
    a comparator coupled to said output detector, said first configurable filter and said audio signal input producing an error signal related to difference therebetween and adjusting said first configurable filter in a distortion correcting manner to provide a preset distortion corrective transfer characteristic; and
    a source of pink noise signals defining a predetermined pink noise signal output response characteristic and wherein said source of pink noise signals injects pink noise signals into said system and wherein said comparator compares said electrical speaker signal to said predetermined pink noise signal output response characteristic and adjusts said first configurable filter to produce said predetermined pink noise signal output response.

2. The system set forth in claim 1 wherein said audio signal input includes a musical instrument pickup supported upon a musical instrument and wherein said speaker output detector includes a first microphone.

3. The system set forth in claim 2 further including a microprocessor and wherein said comparator and said configurable filter are provided within said microprocessor.

4. The system set forth in claim 3 wherein said microprocessor is a digital signal processor and wherein said system includes an analog to digital converter interposed between said microprocessor and said musical instrument pickup and a digital to analog converter interposed between said microprocessor and said speaker.

5. The system set forth in claim 4 further including a speaker drive amplifier coupling said digital to analog converter to said speaker.

6. The system set forth in claim 5 further including a second microphone receiving sound directly from the musical instrument supporting said musical instrument pick up pickup and further including a second configurable filter and wherein said microprocessor responds to audio inputs from said musical instrument pickup and said sound second microphone to configure said second configurable filter to correct the audio input from said musical instrument pickup to conform to the audio input from said second microphone.

7. An audio system operable in a closed loop condition for establishing a preset transfer characteristic used for reduction of distortion when said system is operated in an open loop condition, said system comprising:
    a source of music signals;
    an analog to digital converter coupled to said source of music signals, having a digital signal output;
    a microprocessor having a first input coupled to said digital signal output, a first configurable filter, a second configurable filter, a second input and an output;
    a digital to analog converter coupled to said microprocessor output;
    an amplifier having an input coupled to said digital to analog converter and an output;
    a speaker coupled to said amplifier output;
    a first microphone, positioned to receive sound from said speaker, coupled to said analog to digital converter; and
    a source of pink noise signals coupled to said second microprocessor input, said pink noise signals being characterized by a desired predetermined output response characteristic,
    said microprocessor being operative to receive pink noise signals into said system, compare resulting signals from said first microphone to said predetermined output characteristic and to configure said first configurable filter to cause said resulting signals from said first microphone to conform to said predetermined output characteristic;
    wherein said source of music signals includes a musical instrument pickup driven by a musical instrument and wherein said audio system further includes a second microphone positioned to receive sound from said musical instrument coupled to said analog to digital converter and wherein said microprocessor compares the output of said first microphone to the output of said second microphone and configures said second configurable filter to cause the output of said first microphone to conform to the output of said second microphone.

8. The audio system set forth in claim 7 wherein said microprocessor causes music received from said musical instrument pickup to be filtered by said first and second configurable filters.

9. A method for configuring an audio system for reduced distortion, comprising the steps of:
    providing a musical instrument pickup constructed to produce music signals when a musical instrument is played;
    providing an audio system for amplifying said music signals and providing an audio system output from speakers and having first and second configurable filters;
    providing a source of pink noise signals defining a desired predetermined pink noise output characteristic;
    applying said pink noise signals to said audio system;
    detecting the audio system output produced in response to said applied pink noise signals;

comparing the detected audio system output to the desired predetermined pink noise output characteristic;
configuring said first configurable filter to cause said audio system output to conform to the predetermined pink noise output characteristic;
providing a musical instrument reference signal applied to said audio system;
playing said musical instrument to cause said musical instrument pick up pickup to play music through said audio system;
detecting said audio system output produced by said instrument;
comparing said audio system output produced by said instrument to said audio system output produced by said musical instrument reference signal;
configuring said second configurable filter to cause said audio system output produced by said instrument to conform to that produced by said musical instrument reference signal; and
playing said musical instrument through said audio system using said first and second configurable filters.

10. The method set forth in claim 9 further including the steps of:
performing a comparison of said audio system output to said predetermined pink noise output characteristic following said step of configuring said first configurable filter; and
returning to said step of applying said pink noise signals on a repetitive basis until said audio system output corresponds to said predetermined pink noise output characteristic.

11. The method set forth in claim 10 further including the steps of:
performing a comparison of said audio system output to said musical instrument reference signal following said step of configuring said second configurable filter; and
returning to said step of playing said musical instrument through said audio system on a repetitive basis until said audio system output corresponds to said musical instrument reference.

12. An audio system operable in a closed loop condition for establishing a preset transfer characteristic used for reduction of distortion when said system is operated in an open loop condition, said system comprising:
a musical instrument producing selected notes;
a musical instrument pickup supported by said musical instrument producing pickup signals;
a first microphone proximate said musical instrument producing direct originating music signals;
an amplifier having an input coupled to said pickup and said first microphone and having an amplifier output and a correction filter;
a speaker coupled to said amplifier output;
a second microphone proximate said speaker producing output music;
a processor coupled to said musical instrument pickup, said first microphone and said second microphone having a software correction filter for imparting a correction factor and a memory,
said processor operative as said musical instrument plays a plurality of selected notes to store the pickup signals and direct originating music signals for each note and thereafter said processor plays each stored pickup signal through said amplifier producing speaker music signals at said second microphone which are each compared to the corresponding direct originating music signals for each note to produce a note correction factor, said processor thereafter averaging all of the correction factors to produce an average correction factor that is used to configure said software correction filter for open loop play.

13. The audio system set forth in claim 12 wherein said processor is operative to store a plurality of software filter corrections suitable for use in combination with a plurality of instrument and amplifier combinations.

\* \* \* \* \*